(12) United States Patent
Khlat

(10) Patent No.: US 7,274,748 B1
(45) Date of Patent: Sep. 25, 2007

(54) AM TO FM CORRECTION SYSTEM FOR A POLAR MODULATOR

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 681 days.

(21) Appl. No.: 10/859,718

(22) Filed: Jun. 2, 2004

(51) Int. Cl.
H04L 25/03 (2006.01)

(52) U.S. Cl. ..................................................... 375/296
(58) Field of Classification Search ........ 375/295–297; 330/129; 332/145
See application file for complete search history.

(56) References Cited

U.S. PATENT DOCUMENTS

| | | | |
|---|---|---|---|
| 3,900,823 A | 8/1975 | Sokal et al. ............... 330/149 |
| 4,609,881 A | 9/1986 | Wells ......................... 331/1 A |
| 5,055,802 A | 10/1991 | Hietala et al. ............... 331/16 |
| 5,079,522 A | 1/1992 | Owen et al. ................. 331/16 |
| 5,430,416 A | 7/1995 | Black et al. ............... 332/145 |
| 5,598,436 A | 1/1997 | Brajal et al. ............... 375/297 |
| 5,608,353 A | 3/1997 | Pratt ........................... 330/295 |
| 5,629,648 A | 5/1997 | Pratt ........................... 330/289 |
| 5,952,895 A | 9/1999 | McCune, Jr. et al. ....... 332/128 |
| 6,008,703 A | 12/1999 | Perrott et al. ............... 332/100 |
| 6,130,579 A | 10/2000 | Iyer et al. ................... 330/285 |
| 6,191,656 B1 | 2/2001 | Nadler ....................... 330/288 |
| 6,211,747 B1 | 4/2001 | Trichet et al. ............... 332/128 |
| 6,236,703 B1 | 5/2001 | Riley ........................... 377/48 |
| 6,271,727 B1 | 8/2001 | Schmukler ................. 330/284 |
| 6,285,239 B1 | 9/2001 | Iyer et al. ................... 327/531 |
| 6,307,364 B1 | 10/2001 | Augustine ................... 324/95 |
| 6,356,150 B1 | 3/2002 | Spears et al. .............. 330/145 |
| 6,359,950 B2 | 3/2002 | Gossmann et al. .......... 375/376 |
| 6,366,177 B1 | 4/2002 | McCune et al. ............. 332/103 |
| 6,801,086 B1 | 10/2004 | Chandrasekaran .......... 330/140 |
| 6,834,084 B2 * | 12/2004 | Hietala ....................... 375/296 |
| 2002/0060606 A1 | 5/2002 | Andre ........................ 330/149 |
| 2002/0093378 A1 * | 7/2002 | Nielsen et al. .............. 330/129 |
| 2003/0179830 A1 | 9/2003 | Eidson et al. .............. 375/296 |
| 2003/0215025 A1 | 11/2003 | Hietala ....................... 375/297 |
| 2003/0215026 A1 | 11/2003 | Hietala ....................... 375/297 |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

Primary Examiner—Don N. Vo
(74) Attorney, Agent, or Firm—Withrow & Terranova, PLLC

(57) ABSTRACT

A transmitter for a mobile terminal including a polar modulator that compensates for amplitude to frequency distortion (AM to FM distortion) of a power amplifier in the transmit chain is provided. In general, the modulator includes a polar converter that converts an input signal into an amplitude signal and a phase signal. A phase to frequency converter converts the phase signal into a frequency signal. Based on the amplitude signal, compensation circuitry generates a frequency compensation signal that essentially cancels that AM to FM distortion of the power amplifier. A combiner combines the frequency signal and the frequency compensation signal, and the pre-distorted signal is converted into an analog frequency signal and amplified by the power amplifier. Accordingly, when the pre-distorted signal is amplified by the power amplifier, the frequency compensation signal essentially cancels the AM to FM distortion of the power amplifier.

24 Claims, 6 Drawing Sheets

U.S. PATENT DOCUMENTS

2003/0227342 A1* 12/2003 Liu .............................. 332/145
2004/0072597 A1   4/2004 Epperson et al. ............ 455/572
2004/0183511 A1   9/2004 Dening ........................ 323/282
2004/0198414 A1* 10/2004 Hunton .................... 455/550.1

OTHER PUBLICATIONS

Volder, Jack E., "The CORDIC Trigonometric Computing Technique," IRE Trans. On Elect. Computers p. 330, Sep. 1959.

* cited by examiner

AM TO FM CORRECTION SYSTEM FOR A POLAR MODULATOR

FIELD OF THE INVENTION

The present invention relates to controlling a power amplifier, and more particularly to controlling the power amplifier during polar modulation.

BACKGROUND OF THE INVENTION

Transmitters form a significant portion of most communication circuits. As such, they assume a position of prominence in design concerns. With the proliferation of mobile terminals, transmitter design has progressed in leaps and bounds as designers try to minimize components and reduce size, power consumption, and the like. Likewise, modulation schemes are continuously updated to reflect new approaches to maximize information transfers within limited bandwidth constraints. Changes in standards or standards based on newly available spectrum may also cause designers to approach modulator designing with different techniques.

Many different standards and modulation schemes exist, but one of the most prevalently used in the world of mobile terminals is the Global System for Mobile Communications (GSM). GSM comes in many flavors, not the least of which is General Packet Radio Services (GPRS). GPRS is a new non-voice value-added service that allows information to be sent and received across a mobile telephone network. It supplements today's Circuit Switched Data and Short Message Service. GSM allows many different types of mobile terminals, such as cellular phones, pagers, wireless modem adapted laptops, and the like, to communicate wirelessly through the Public Land Mobile Network (PLMN) to the Public Switched Telephone Network (PSTN).

One relatively recent change has been the advent of the Enhanced Data for GSM Evolution (EDGE) scheme in GSM systems. This system contains amplitude modulation components, and, as a result, the power amplifier must be linear and should not operate in saturation when classical modulation techniques are employed. Such a linear system lacks the efficiency of one that operates the power amplifier in saturation.

If a polar modulation system is used instead of a classical modulation system, then the power amplifier may operate in saturation and efficiency is greatly improved. In addition, if the polar signals are generated by a digital method, such a system does not require the use of a quadrature modulator. Quadrature modulators are undesirable from a design standpoint in that they draw large amounts of current, and hence, drain batteries comparatively fast.

In a polar modulation system, the amplitude signal that controls the power amplifier will cause unwanted phase components to be created in the output of the power amplifier due to the non-linearities of the power amplifier. This is sometimes called amplitude to phase (AM to PM) distortion, and it degrades the spectral purity of the system and the Error Vector Magnitude. Thus, a need also exists to be able to compensate for the unwanted AM to PM distortion of the transmitted phase signal.

One solution used to compensate for AM to PM distortion is to measure the AM to PM distortion of the power amplifier, and then create a polynomial for phase predistortion that is used to distort a signal prior to amplification by the power amplifier. This predistortion offsets the AM to PM distortion of the power amplifier. However, the polynomial is often at least a third order polynomial and is costly to implement. Thus, there remains a need for a more cost effective system for correcting AM to PM distortion of a power amplifier.

SUMMARY OF THE INVENTION

The present provides a transmitter for a mobile terminal including a polar modulator that compensates for amplitude to frequency distortion (AM to FM distortion) of a power amplifier in the transmit chain. In doing so, a frequency component of an amplitude to phase distortion (AM to PM distortion) of the power amplifier is counteracted such that only a constant phase offset remains in an output of the power amplifier. This constant phase offset is easily compensated for in an associated receiver.

In general, the modulator includes a polar converter that converts an input signal into an amplitude signal and a phase signal. A phase to frequency converter converts the phase signal into a frequency signal. Based on the amplitude signal, compensation circuitry generates a frequency compensation signal that is combined with the frequency signal and essentially cancels that AM to FM distortion of the power amplifier. The pre-distorted signal is amplified by the power amplifier, and the frequency compensation signal essentially cancels the AM to FM distortion of the power amplifier.

The compensation circuitry generates the frequency compensation signal based on the amplitude signal and a polynomial defined by a set of coefficients. More particularly, in one embodiment, the compensation circuitry generates the frequency compensation signal based on a product of the polynomial and a derivative of the amplitude signal. The coefficients are such that the product of the polynomial and the derivative of the amplitude signal, and thus the frequency compensation signal, is essentially a derivative of a function that essentially cancels an AM to PM distortion of the power amplifier. Thus, the frequency compensation signal essentially cancels the AM to FM distortion of the power amplifier.

In another embodiment, the compensation circuitry generates the frequency compensation signal based on the amplitude signal and an output power level of the power amplifier. In this embodiment, the frequency compensation signal is generated based on a set of coefficients selected from numerous set of coefficients based on the output power level of the power amplifier. Each of the sets of coefficients defines a polynomial corresponding to one of the output power levels of the power amplifier. The sets of coefficients are provided based on different predistortion criteria for each output power level. In one embodiment, each of the sets of coefficients is provided such that a product of the polynomial defined by the set of coefficients and a derivative of the amplitude signal essentially the inverse of the AM to FM distortion of the power amplifier for the corresponding output power level.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

While the present invention is particularly well-suited for use in a mobile terminal, and particularly a mobile terminal that is operating in an Enhanced Data for GSM Evolution (EDGE) scheme in a GSM system, it should be appreciated that the present invention may be used in other transmitters, either wireless or wirebased, as needed or desired.

Figure 1:
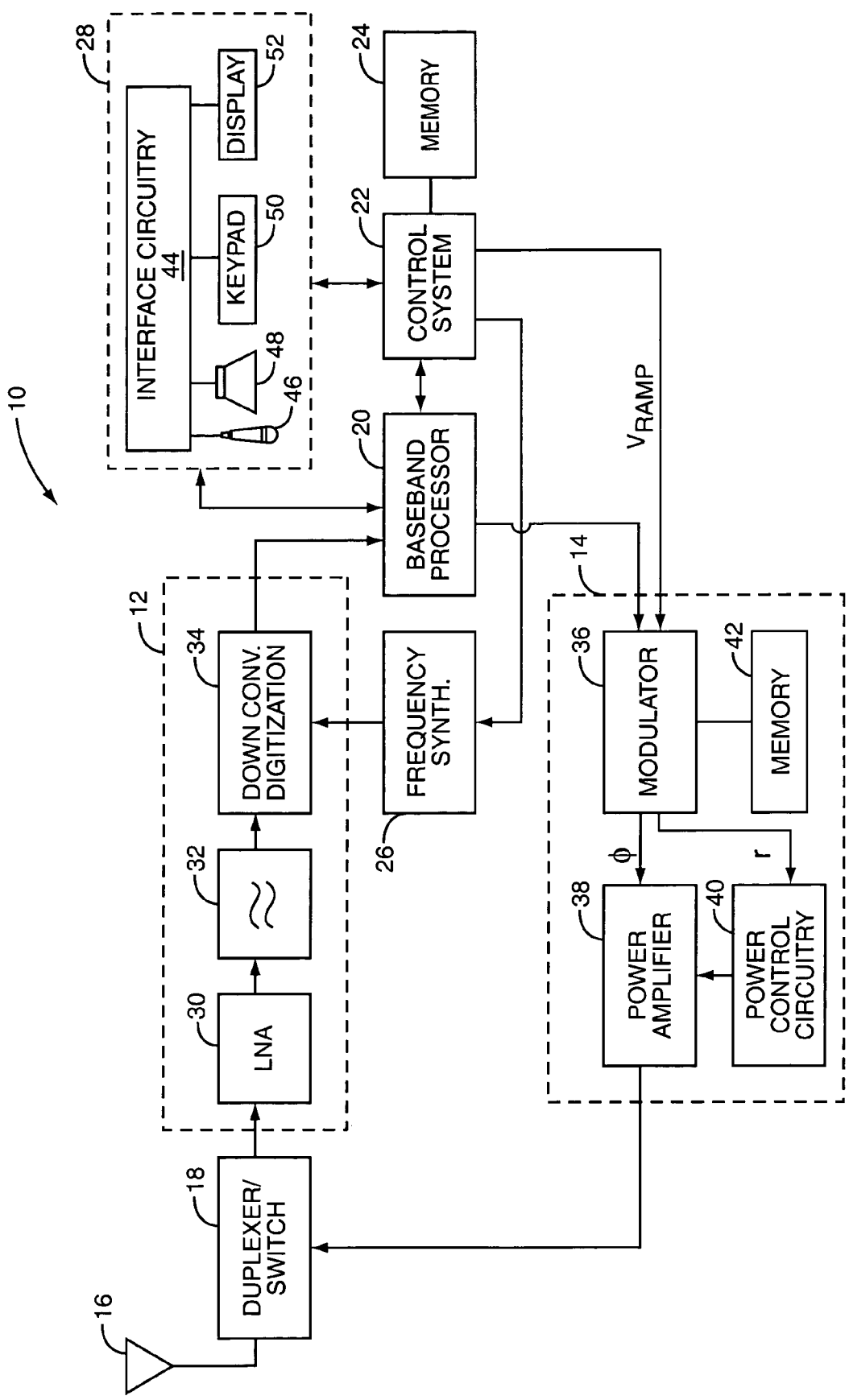
FIG. 1 illustrates a mobile terminal according to one embodiment of the present invention.

The present invention is preferably incorporated in a mobile terminal 10, such as a mobile telephone, personal digital assistant, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. A modulator 36 receives the encoded data and operates according to a polar modulation scheme to provide a phase component ($\phi$) at a desired transmit frequency and an amplitude component (r) for controlling an output power of the power amplifier circuitry 38 via the power control circuitry 40. As described below in detail, one or both of the phase component ($\phi$) and the amplitude component (r) are pre-distorted by the modulator 36. The memory 42 may be used to store coefficients of multiple polynomials used by the modulator 36 for pre-distorting one or both of the phase component ($\phi$) and the amplitude component (r).

The power amplifier circuitry 38 amplifies the phase component ($\phi$) to a level appropriate for transmission from the antenna 16. A gain of the power amplifier circuitry 38 is controlled by the power control circuitry 40, which is controlled by the amplitude component (r) from the modulator 36. Thus, in essence, the power control circuitry 40 operates to control a supply voltage provided to the power amplifier circuitry 38 based on the amplitude component (r) from the modulator 36, thereby controlling an output power of the power amplifier 38 based on the amplitude component (r). It should be noted that, in this embodiment, the modulator 36 may also operate to adjust the amplitude component (r) based on an adjustable power control signal ($V_{RAMP}$) from the control system 22.

A user may interact with the mobile terminal 10 via the interface 28, which may include interface circuitry 44 associated with a microphone 46, a speaker 48, a keypad 50, and a display 52. The interface circuitry 44 typically includes analog-to-digital converters, digital-to-analog converters, amplifiers, and the like. Additionally, it may include a voice encoder/decoder, in which case it may communicate directly with the baseband processor 20.

The microphone 46 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 48 by the interface circuitry 44. The keypad 50 and display 52 enable the user to interact with the mobile terminal 10, input numbers to be dialed and address book information, or the like, as well as monitor call progress information.

While the present invention is well-suited for incorporation into a mobile terminal, such as the mobile terminal 10 just described, it should be noted that the present invention is well-suited for use in any wireless transmitter. Types of wireless transmitters include the transmitter section 14 of the mobile terminal 10, a wireless transmitter associated with a wireless LAN, and the like. As such, the present invention is not limited to a particular apparatus.

Figure 2:
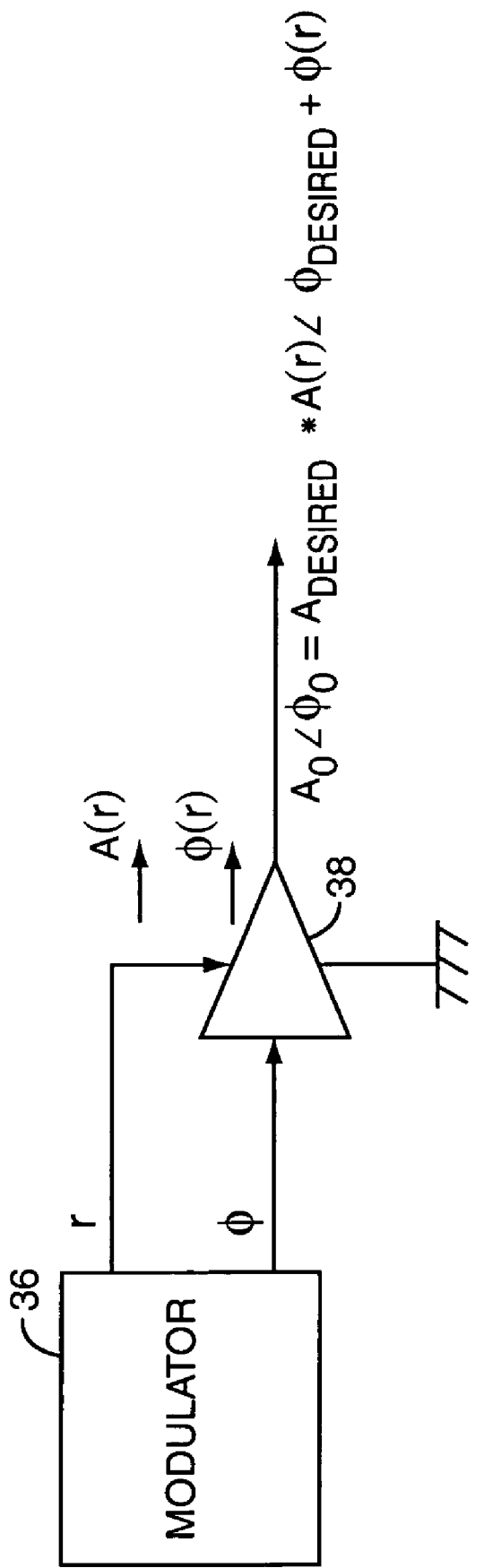
FIG. 2 illustrates AM to AM and AM to PM distortion of a typical power amplifier.

In the past, as illustrated in FIG. 2, the modulator 36 directed two signals to the power amplifier 38. In an exemplary prior art embodiment, a polar modulator 36 directed an amplitude signal (r) and a phase signal ($\phi$) to the power amplifier 38. The amplitude signal (r) controlled the power supply voltage of the power amplifier 38, potentially replacing or including the power control circuitry 40, while the phase signal ($\phi$) was amplified by the power amplifier 38 to create $A_{DESIRED} \angle \phi_{DESIRED}$. The output ($A_o \angle \phi_o$) of the power amplifier 38 was corrupted by AM to PM distortion within the non-linear power amplifier 38, represented by φ(r), and AM to AM distortion, represented by A(r), resulting in an output signal of $A_{DESIRED}*A(r) \angle \phi_{DESIRED} + \phi(r)$.

Figure 3:
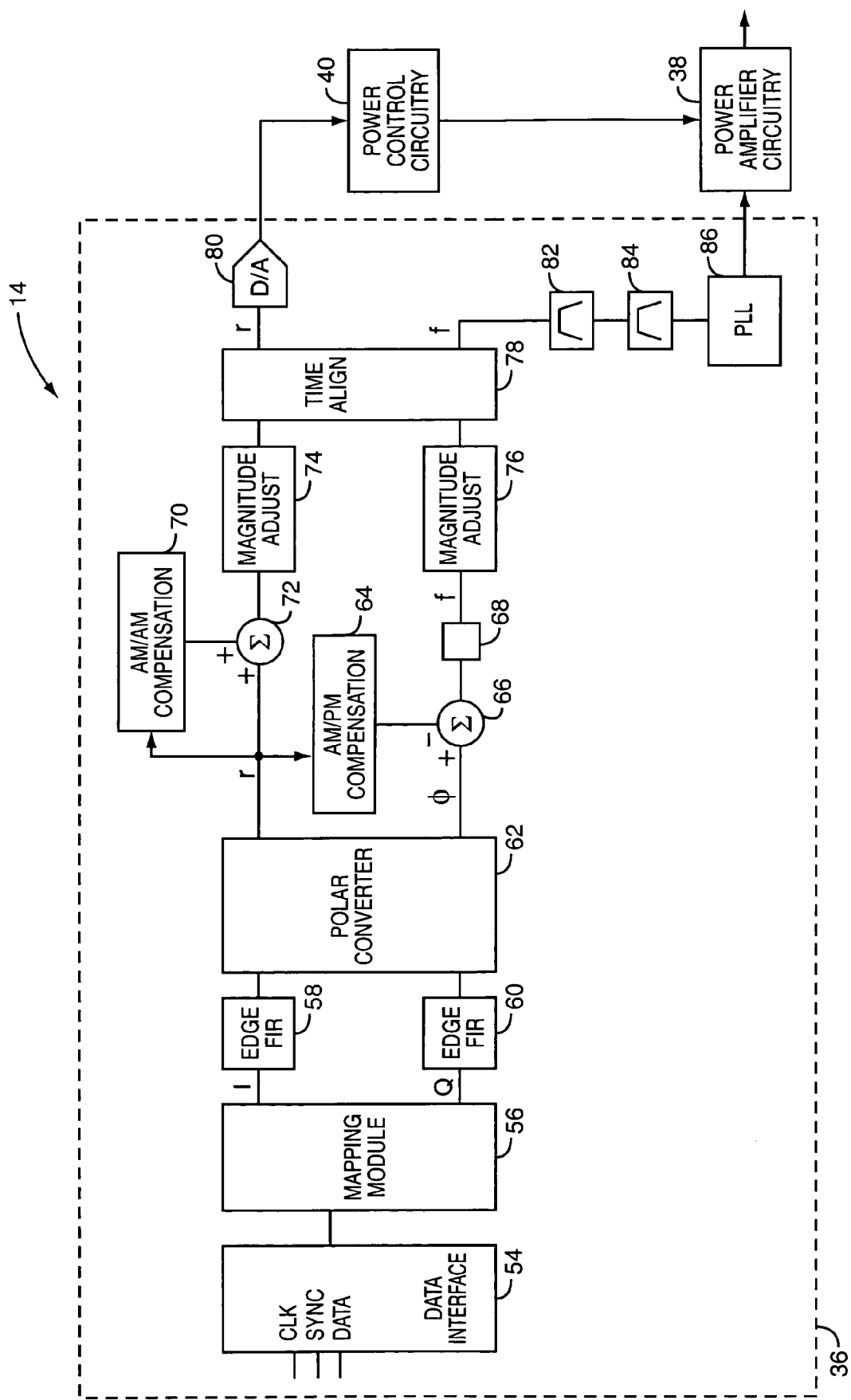
FIG. 3 illustrates one embodiment of a modulator in a transmitter of a mobile terminal providing AM to PM compensation.
Figure 5:
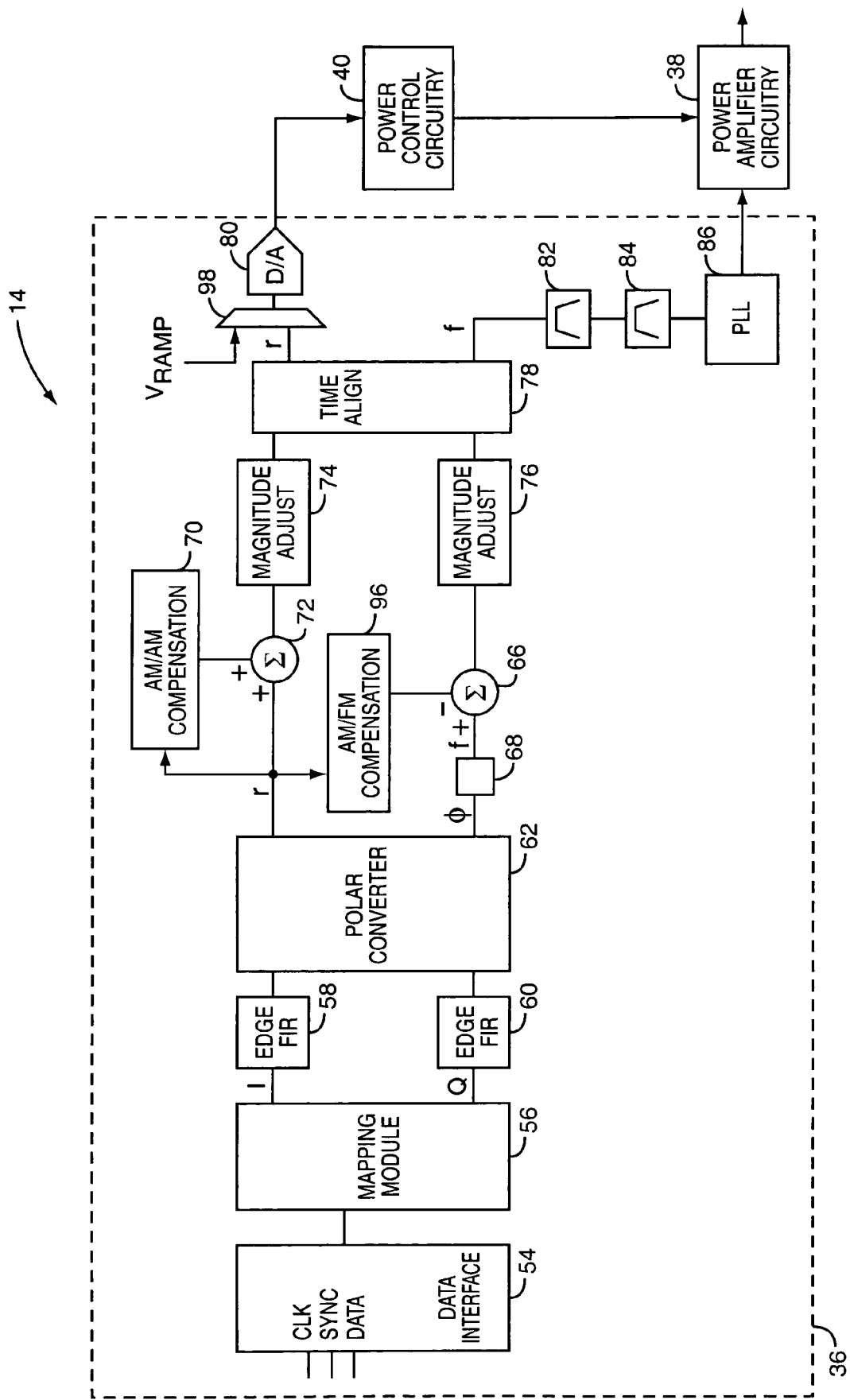
FIG. 5 illustrates a modulator in a transmitter of a mobile terminal providing AM to FM compensation according to one embodiment of the present invention.

Before discussing the modulator 36 of the present invention, which is illustrated in FIG. 5, it is beneficial to discuss one embodiment of the modulator 36 that corrects both the AM to PM distortion and the AM to AM distortion illustrated in FIG. 3. This embodiment is essentially the same as that disclosed and described in commonly owned and assigned U.S. patent application Ser. No. 10/147,569 entitled AM TO PM CORRECTION SYSTEM FOR POLAR MODULATOR filed May 16, 2002, which is hereby incorporated by reference in it entirety. In general, the modulator 36 corrects the AM to PM distortion within the output by preliminarily distorting the phase signal (φ) such that when it is converted to a frequency signal and amplified by the power amplifier 38, the predistortion element cancels the AM to PM distortion element introduced by the amplitude signal (r). The modulator 36 corrects the AM to AM distortion within the output by preliminarily distorting the amplitude signal (r) such that the predistortion element cancels the AM to AM distortion element introduced by the amplitude signal (r).

More specifically, the radio frequency transmitter section 14, and particularly the modulator 36, includes several components, including a serial interface 54, a mapping module 56, first and second filters 58, 60, and a polar converter 62. Other components of the modulator 36 will be discussed below. The serial interface 54 receives Non-Return to Zero (NRZ) serial data from the baseband processor 20 at the bit rate of the system. For example, NRZ serial data may be a 1B1B code with one line bit for each associated binary bit. In an exemplary embodiment, the modulation scheme for the modulator 36 uses an EDGE modulation scheme, and thus, the bit rate is 812.5 kbps. This data is passed to the mapping module 56, where the data is grouped into symbols of three consecutive data bits, Grey coded, and rotated by 3π/8 on each symbol as per European Telecommunications Standards Institute (ETSI) specifications. The resulting symbol is mapped to one of sixteen points in an I, Q constellation.

Both the I and the Q components for each point are then filtered by the first and second filters 58, 60 respectively. In an exemplary embodiment, the first and second filters 58, 60 are EDGE finite impulse response (FIR) filters. This, as dictated by the ETSI specifications, shapes the response between symbol times.

After filtering, both the I and Q components are sent to the polar converter 62. The polar converter 62 uses a classical CORDIC (coordinate rotation digital computer) algorithm or like rectangular to polar conversion technique. Thus, the polar converter 62 generates phase (φ) and amplitude (r) equivalent signals. Further information about CORDIC algorithms may be found in *Proceedings of the 1998 ACM/SIGDA Sixth International Symposium On Field Programmable Gate Arrays* by Ray Andraka, Feb. 22-24, pp.191-200 and "The CORDIC Trigonometric Computing Technique" by Jack E. Volder *IRE Trans on Elect. Computers*, p.330, 1959, both of which are hereby incorporated by reference in their entirety.

The amplitude signal (r) is split and directed to AM to PM compensation circuitry 64. The AM to PM compensation circuitry 64 introduces a compensation term to the phase signal (φ) that, after further processing, counteracts the distortion introduced by the AM to PM distortion in the power amplifier 38.

The AM to PM compensation circuitry 64 acts to create a polynomial along the lines of the following equation:

$$\phi'(r) = \sum_{i=0}^{M} C_i (r(n))^i$$

As an example, if M=3, the equation expands to the following:

$$\phi'(r) = C_0 + C_1 r(n) + C_2 (r(n))^2 + C_3 (r(n))^3$$

where φ'(r) is termed herein a phase compensation signal and r(n) is a digital representation of the amplitude signal (r) and may alternatively be replaced by a continuous-time representation r(t). It is readily apparent that φ'(r) has an offset term, a linear term, a quadratic term, and a cubic term selectable by the hardware implementation.

In an exemplary embodiment of the present invention, the coefficients $C_i$ are associated with the control system 22, and particularly stored in non-volatile memory 24 associated therewith. Alternatively, the coefficients may be stored in the memory 42 if such is present. In an exemplary embodiment, the coefficients may be stored as a look up table. It is further possible that the coefficients are stored as a function of sequential steps performed by hardware. The coefficients are determined through a best fit analysis of a function that substantially matches the unamplified inverse of the AM to PM distortion φ(r). In another embodiment, a piecewise function is created with each piece being determined by a given power level. This is done to improve the fit between the functions. For example, if only one set of coefficients were used, φ'(r) might not fit well at the ends or perhaps in the middle of the relevant range of values. By implementing a piecewise function, a good fit between the equations may be achieved throughout the curve of relevant values. In an exemplary embodiment, a set of coefficients is created for each 2 dBm power step. This corresponds to the power steps defined in the ETSI standards. To calculate the coefficients, a program such as MATHCAD may be used to derive a match to an empirical power amplifier curve. The coefficients may be tested through an ADS simulation or the like.

The output of the AM to PM compensation circuitry 64 is subtracted from the phase signal (φ) by an adder 66 to create a pre-distorted signal. The adder 66 is also termed herein a combiner. The output of the adder 66 (the pre-distorted signal) is directed to a phase to frequency converter 68 where the output is converted to a frequency signal (f). More detail on the phase to frequency converter 68 is provided below with reference to FIG. 4.

Similarly, the amplitude component (r) is provided to AM to AM compensation circuitry 70. The AM to AM compensation circuitry 70 introduces a compensation term to the amplitude signal (r) that, after further processing, counteracts the distortion introduced by the AM to AM distortion in the power amplifier 38.

The AM to AM compensation circuitry 70 acts to create a polynomial along the lines of the following equation:

$$A'(r) = \sum_{i=0}^{M} C_i (r())^i$$

As an example, if M=3, the equation expands to the following:

$$A'(r) = C_0 + C_1 r(n) + C_2 (r(n))^2 + C_3 (r(n))^3$$

where A'(r) is termed herein an amplitude compensation signal. It is readily apparent that A'(r) has an offset term, a linear term, a quadratic term, and a cubic term selectable by the hardware implementation. In an exemplary embodiment, the offset term $C_0$ and the coefficient for the linear term $C_1$ are zero. An offset term would act the same as increasing or decreasing the output power level. Since the adjustable power control signal ($V_{RAMP}$) addresses this, it is not necessary to repeat the control here. Likewise, a linear term would only change the fundamental amplitude and not change the shape of the curve, so a linear term for this compensation signal makes little sense.

When the exemplary embodiment A'(r) is combined with r(n) in the adder 72, the pre-distorted signal is:

$$r'(n)=r(n)+C_2(r(n))^2+C_3(r(n))^3$$

which converts to the following:

$$r'(n)=r(n)*[1+C_2(r(n))+C_3(r(n))^2]$$

Thus, even though the adder 72 is an adder, the effect is to multiply the term r(n) by a correction factor that deviates from unity by A'(r). This signal then passes through the power amplifier 38 with AM to AM distortion. This distortion, as previously noted, is A(r). The goal is thus to make the term $[1+C_2(r(n))+C_3(r(n))^2]$ the inverse of the AM to AM distortion such that $A(r)*[1+C_2(r(n))+C_3(r(n))^2]=1$. When this condition is true, the AM to AM distortion has been canceled.

Alternatively, if the adder 72 were instead a multiplier, then the correction terms could have a linear term and an offset term. From a design standpoint, this removes a multiplier from the AM to AM compensation circuitry 70 and inserts a multiplier in place of the adder 72. The concept of canceling the AM to AM distortion with its inverse remains the same.

In an exemplary embodiment, the coefficients Ci for the polynomial defining A'(r) are associated with control system 22, and particularly in non-volatile memory 24 associated therewith. Alternatively, the coefficients may be stored in the memory 42, if such is present. In another exemplary embodiment, the coefficients may be stored in a look up table or the like. It is further possible that the coefficients are created as a function of hardware. The coefficients are determined through a best fit analysis of a function that matches the expected AM to AM distortion A(r). In a more preferred embodiment, a piecewise function is created with each piece being determined by a given power level. This is done to improve the fit between the functions. For example, if only one set of coefficients were used, A'(r) might not fit well at the ends or perhaps in the middle of the relevant range of values. By implementing a piecewise function, a good fit between the equations may be achieved throughout the curve of relevant values. In an exemplary embodiment, a set of coefficients is created for each 2 dBm power step. This corresponds to the power steps defined in the ETSI standards.

To calculate the coefficients, a program such as MATH-CAD may be used to derive a match to an empirical power amplifier curve. The coefficients may be tested through an ADS simulation or the like.

After compensation of the amplitude signal (r) and conversion of the compensated phase signal (φ) to the frequency signal (f), magnitude adjusters 74, 76 adjust the magnitude of the amplitude signal (r) and the frequency signal (f) to a level expected by the time aligner 78, such that they comply with the appropriate standard. Next, a relative time delay is applied as necessary to the signals for best Error Vector Magnitude (EVM) and spectrum by the time aligner 78. Because these are preferably digital components, concerns about variations in analog components and the corresponding variation in time delays downstream are minimized.

At this point, the amplitude signal (r) and the frequency signal (f) separate and proceed by different paths, an amplitude signal processing path and a frequency signal processing path, to the power amplifier 38. With respect to the amplitude signal processing path, the amplitude signal is converted to an analog signal by D/A converter 80. While not shown, a ramping function may be combined with the amplitude signal prior to digital-to-analog conversion. The output of the D/A converter 80 is used to by the power control circuitry 40 to set the collector voltage on the power amplifier 38. As the amplitude signal changes, the voltage at the collector of the power amplifier 38 changes, and the output power will vary as $V^2/R_{out}$ ($R_{out}$ is not shown, but is effectively the load on the power amplifier 40). This is sometimes known as "plate modulation".

The frequency signal is directed to a digital filter 82, a digital predistortion filter 84, and a phase locked loop (PLL) 86, as is described in commonly owned and assigned U.S. patent application Ser. No. 10/139,560, filed 06 May 2002, entitled DIRECT DIGITAL POLAR MODULATOR, which is hereby incorporated by reference in its entirety. The PLL 86 generates an output at the desired radio frequency. In an exemplary embodiment, the frequency signal is applied to a single port on a fractional N divider within the PLL 86.

In general, the PLL 86 operates to convert the frequency signal (f), which is a digital signal, into an analog frequency signal. The PLL 86 comprises a reference source that is fed to a phase comparator. The phase comparator compares the edges of the reference source to the output of the fractional N divider and produces a correction signal. The correction signal is low pass filtered and input to a voltage controlled oscillator (VCO). The VCO outputs a frequency modulated signal at the RF carrier, which in turn is fed back to the fractional N divider. The divisor of the fractional N divider is modulated by the frequency signal. Further information on fractional N PLLs, how to modulate a signal by varying the fractional N divider, and the like may be found in U.S. Pat. Nos. 6,359,950; 6,236,703; 6,211,747; 5,079,522; 5,055,802; and 4,609,881 which are hereby incorporated by reference in their entireties.

The phase to frequency converter 68 is explicated with reference to FIG. 5. The phase signal (φ) arrives and is split into a delay path and a normal path. A clock 88 controls a delay element 90 in the delay path. The output of the delay element 90 is subtracted from the normal path by adder 92. The output of the adder 92 is multiplied by 2π in a multiplier 94, and a frequency signal (f) is output. This structure takes advantage of the relationship $$f = 2\pi \frac{d\phi}{dt}$$

in a digital sense. The delay and the subtraction approximates the derivative as (φ(n)−φ(n−1))/T, where T is the period for the clock 88. Other phase to frequency conversions could also be used if needed or desired.

Since the adder 66 sums the phase signal (φ) and the phase compensation signal (φ'), the phase to frequency converter 68 effectively approximates a derivative of both the phase signal (φ) and the phase compensation signal (φ'). However, the approximation of the derivative of the phase compensation signal (φ') creates a small error. More specifically, the approximate derivative of the phase compensation signal (φ') produced by the phase to frequency converter 68 is:

$$\frac{d(\phi')}{dt} \cong f_{SAMP} * [\phi'(n) - \phi'(n-1)],$$

where $f_{SAMP}$ is a sampling frequency and defines a time between the n and n−1 samples. Since in an exemplary embodiment the phase compensation signal (φ') may be defined as:

$$\phi'+(n) = C_1 * r(n) + C_2 * r^2(n) + C_3 * r^3(n),$$

the equation expands to:

$$\frac{d(\phi')}{dt} \cong f_{SAMP} * \{C_1 * [r(n) - r(n-1)] + C_2 * [r^2(n) - r^2(n-1)] + C_3 * [r^3(n) - r^3(n-1)]\}$$

$$\frac{d(\phi')}{dt} \cong f_{SAMP} * [r(n) - r(n-1)] * \{C_1 + C_2[r(n) + r(n-1)] + C_3[r^2(n) + r^2(n-1) + r(n) * r(n-1)]\}$$

and if $$\Delta r(n) = r(n) - r(n-1),$$

then $$\frac{d(\phi')}{dt} \cong f_{SAMP} * \Delta r(n) * \{C_1 + C_2[r(n) + r(n-1)] + C_3[r^2(n) + r^2(n-1) + r(n) * r(n-1)]\},$$

where, for the $C_2$ term, $$r(n) + r(n-1) = 2r(n) - \Delta r(n).$$

However, ideally $$\frac{d(\phi')}{dt} \cong \frac{d(r)}{dt} * \{C_1 + C_2 * 2 * r(n) + C_3 * 3 * r^2(n)\}, \text{ where}$$

$$\frac{d(r)}{dt} \cong f_{SAMP} * \Delta r(n).$$

Thus, ideally, the $C_2$ term is $C_2 * 2 * r(n)$. However, the approximation of the derivative of the phase compensation signal (φ') produces the $C_2$ term as $C_2 * [2 * r(n) - \Delta r(n)]$. Accordingly, the approximation of the derivative of the phase compensation signal (φ') produces an error of $-\Delta r(n)$ in the $C_2$ term. Similarly, an error is produced for the $C_3$ term.

FIG. 5 illustrates the modulator 36 according to one embodiment of the present invention. In general, the modulator 36 operates to provide AM to FM compensation rather than AM to PM compensation. In doing so, the phase to frequency conversion occurs prior to compensation, thereby eliminating the errors created by the phase to frequency conversion after compensation described above. In addition, the polynomial used for AM to FM compensation is one order less than the polynomial used for the AM to PM compensation described above.

More specifically, the modulator 36 includes the data interface 54, the mapping module 56, the filters 58, 60, and the polar converter 62, as described above. The modulator 36 also includes the AM to AM compensation circuitry 70 and the adder 72 for compensating the amplitude signal (r) to essentially cancel the AM to AM distortion of the power amplifier 38. Since these components operate as described above, they are not described again for conciseness. However, it should be noted that the AM to AM compensation circuitry 70 and the adder 72 are optional components and are not necessary for the present invention.

According to the present invention, the phase signal (φ) is first passed to the phase to frequency converter 68. AM to FM compensation circuitry 96 acts to create a frequency compensation signal (f') defined as:

$$f(r) = \frac{d(\phi'(r))}{dt}.$$

As an example, if N=3 and $$\phi'(r) = C_0 + C_1 r(n) + C_2 (r(n))^2 + C_3 (r(n))^3$$

then $$f(r) = \frac{d(\phi'(r))}{dt} = [C_1 + 2C_2(r(n)) + 3C_3(r(n))^2] * \Delta r(n) * f_{SAMP}.$$

Figure 4:
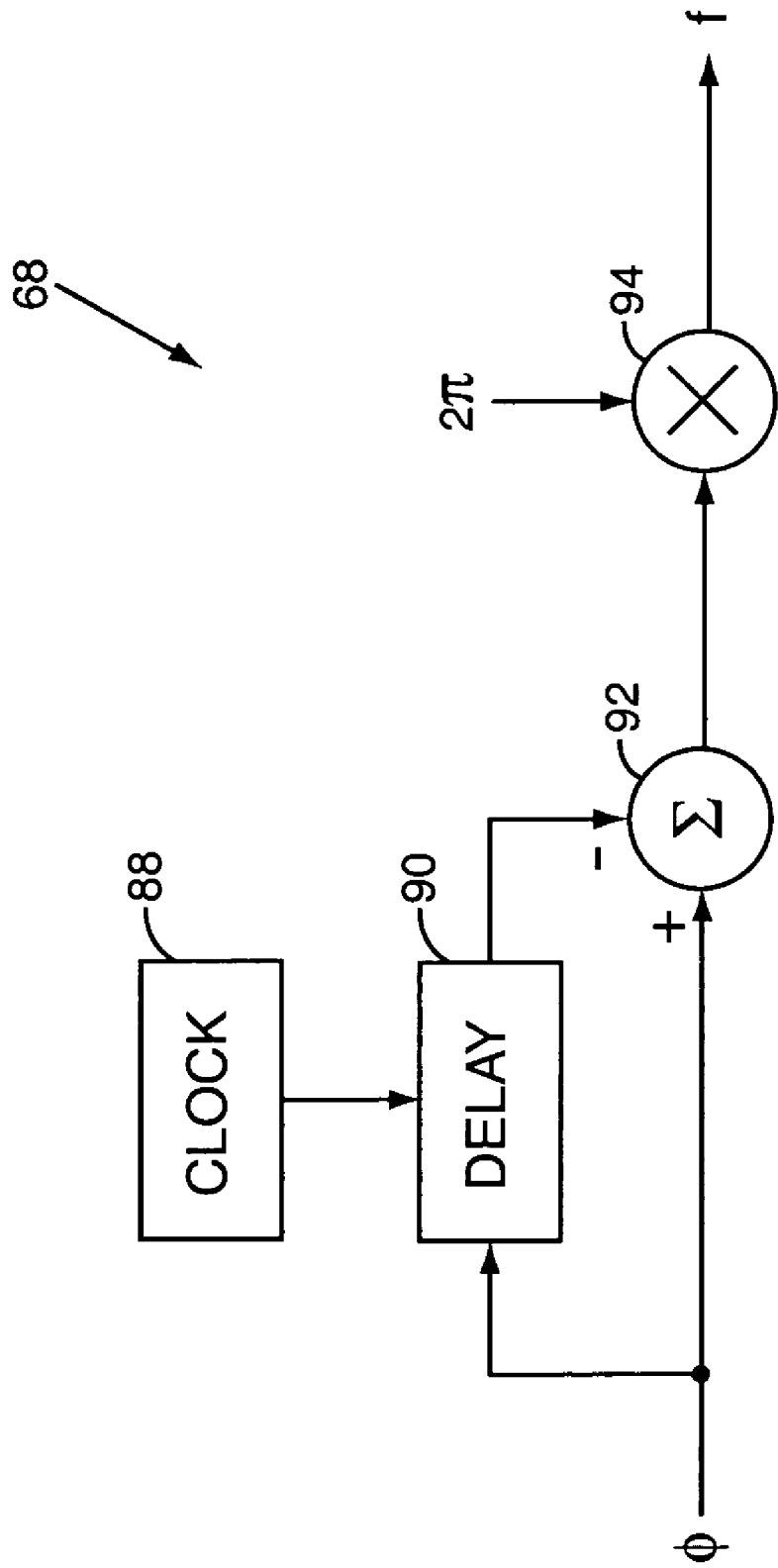
FIG. 4 illustrates one embodiment of a phase to frequency converter.

Thus, the frequency compensation signal (f') includes a polynomial term, which in this example is $C_1 + 2C_2(r(n)) + 3C_3 (r(n))^2$ multiplied by the derivative of the amplitude signal (r), which is approximated by $\Delta r(n) * f_{SAMP}$. Further, the polynomial in the equation for the frequency compensation signal (f') is one order less than the polynomial defining the phase compensation signal (φ'). In this example, the polynomial defining the frequency compensation signal (f') is second order while the polynomial defining the phase compensation signal (φ') is third order. Thus, the complexity of the modulator 36 is reduced and the size of the memory 24 or 42 that stores the coefficients for the polynomials for various power levels is further reduced. Further, since the phase signal (φ) is converted to the frequency signal (f) before compensation, the errors caused by the approximation of the derivative of the phase compensation signal (φ') described with respect to FIGS. 3 and 4 are eliminated.

In an exemplary embodiment of the present invention, the coefficients $C_i$ in the equation for the frequency compensation signal (f') are associated with the control system 22, and particularly stored in non-volatile memory 24 associated therewith. Alternatively, the coefficients may be stored in the memory 42 if such is present. In an exemplary embodiment, the coefficients may be stored as a look up table. It is further possible that the coefficients are stored as a function of sequential steps performed by hardware. The coefficients are determined through a best fit analysis of a function that substantially matches the unamplified inverse of an AM to FM distortion of the power amplifier circuitry 38, which is the derivative of the AM to PM distortion φ(r). In a more preferred embodiment, a piecewise function is created with each piece being determined by a given power level. This is done to improve the fit between the functions. For example, if only one set of coefficients were used, f'(r) might not fit well at the ends or perhaps in the middle of the relevant range of values. By implementing a piecewise function, a good fit between the equations may be achieved throughout the curve of relevant values. In an exemplary embodiment, a set of coefficients is created for each 2 dBm power step. This corresponds to the power steps defined in the ETSI standards. To calculate the coefficients, a program such as MATHCAD may be used to derive a match to an empirical power amplifier curve. The coefficients may be tested through an ADS simulation or the like.

The output of the AM to FM compensation circuitry 96 is subtracted from the frequency signal (f) by the adder 66 to create a pre-distorted signal. The adder 66 is also termed herein a combiner. After compensation of the amplitude signal (r) and the frequency signal (f), the magnitude adjusters 74, 76 adjust the magnitude of the amplitude signal (r) and the frequency signal (f) to a level expected by the time aligner 78, such that they comply with the appropriate standard. Next, a relative time delay is applied as necessary to the signals for best Error Vector Magnitude (EVM) and spectrum by the time aligner 78. Because these are preferably digital components, concerns about variations in analog components and the corresponding variation in time delays downstream are minimized.

At this point, the amplitude signal (r) and the frequency signal (f) separate and proceed by different paths, the amplitude signal processing path and the frequency signal processing path, to the power amplifier 38. With respect to the amplitude signal processing path, the adjustable power control signal ($V_{RAMP}$), or a ramping function, is combined with the amplitude signal by multiplication circuitry 98 prior to digital-to-analog conversion by the D/A converter 80. It should be noted that in one embodiment, the modulator 36 generates the adjustable power control signal ($V_{RAMP}$) based on a stored ramping table and a transmit power control signal from the control system 22. In this alternative embodiment, the transmit power control signal determines a gain to be applied to the ramping function stored in the ramping table.

The output of the D/A converter 80 is used by the power control circuitry 40 to set the collector voltage on the power amplifier 38. As the amplitude signal (r) changes, the voltage at the collector of the power amplifier 38 changes, and the output power will vary as $V^2/R_{out}$ ($R_{out}$ is not shown, but is effectively the load on the power amplifier 40).

As described above, the frequency signal (f) is directed to the digital filter 82, the digital predistortion filter 84, and the phase locked loop (PLL) 86. The PLL 86 generates an output at the desired radio frequency. In an exemplary embodiment, the frequency signal is applied to a single port on a fractional N divider within the PLL 86. The output of the PLL is provided to the power amplifier circuitry 38 where it is amplified to an appropriate level based on the supply voltage from the power control circuitry 40 and passed to the antenna 16 (FIG. 1) for transmission.

It should be noted that the AM to FM compensation scheme of FIG. 5 compensates for the change in the AM to PM distortion of the power amplifier circuitry 38 with respect to time. In other words, since the frequency compensation signal is essentially the derivative of the phase compensation signal, the coefficient $C_0$ of the equation for the phase compensation signal ($\phi'$) is not included in the polynomial defining the frequency compensation signal (f'). Accordingly, the AM to FM compensation scheme produces a constant phase offset in the output of the power amplifier circuitry 38. Since the constant phase offset does not change over time due to changes in the amplitude signal (r), the constant phase offset is easily compensated for in an associated receiver.

Figure 6:
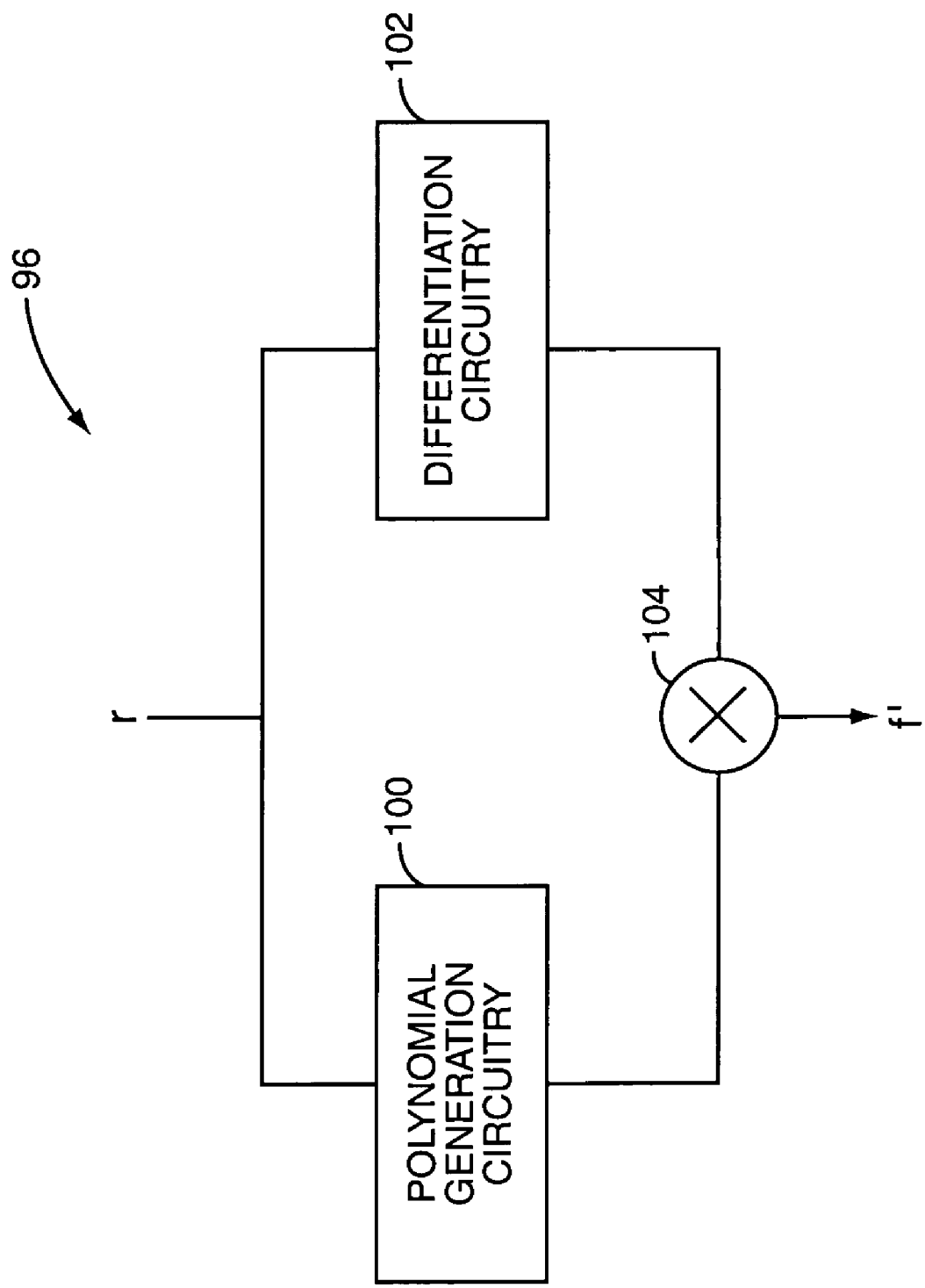
FIG. 6 illustrates AM to FM compensation circuitry according to one embodiment of the present invention.

FIG. 6 illustrates one embodiment of the AM to FM compensation circuitry 96. In general, the AM to FM compensation circuitry 96 is a hardware implementation of the equation for the frequency compensation signal (f') given above. In this exemplary embodiment, the AM to FM compensation circuitry 96 includes polynomial signal generation circuitry 100 which generates a polynomial signal corresponding to the polynomial in the equation for the frequency compensation signal (f'). Differentiation circuitry 102 operates to produce a signal corresponding to the derivative of the amplitude signal (r). In one embodiment, the differentiation circuitry 102 is essentially the same as the phase to frequency converter 68 of FIG. 4 without the multiplier 94. Multiplication circuitry 104 operates to multiply the polynomial signal and the signal from the differentiation circuitry 102 to provide the frequency compensation signal.

Those skilled in the art will recognize improvements and modifications to the preferred embodiments of the present invention. All such improvements and modifications are considered within the scope of the concepts disclosed herein and the claims that follow.

What is claimed is:

1. A transmitter comprising:
   a polar converter adapted to convert a quadrature signal into a polar signal comprising an amplitude signal and a phase signal;
   a phase to frequency converter adapted to convert the phase signal into a frequency signal;
   compensation circuitry adapted to provide a frequency compensation signal based on the amplitude signal such that the frequency compensation signal is essentially an inverse of AM to FM distortion of power amplifier circuitry associated with the transmitter; and
   a combiner adapted to combine the frequency signal and the frequency compensation signal to provide a pre-distorted frequency signal.

2. The transmitter of claim 1 wherein the compensation circuitry further provides the frequency compensation signal based on a power level of the amplifier circuitry.

3. The transmitter of claim 1 wherein the compensation circuitry further provides the frequency compensation signal based on a polynomial defined by a set of coefficients.

4. The transmitter of claim 3 wherein the polynomial is at least a first order polynomial.

5. The transmitter of claim 3 wherein the set of coefficients defining the polynomial is selected from a plurality of sets of coefficients defining a plurality of polynomials based on an output power level of the amplifier circuitry.

6. The transmitter of claim 5 wherein each of the plurality of polynomials corresponds to one of a plurality of output power levels and the plurality of sets of coefficients defining the plurality of polynomials are provided based on different predistortion criteria for each of the plurality of power levels.

7. The transmitter of claim 5 wherein the plurality of sets of coefficients are provided such that for each of the plurality of polynomials the frequency compensation signal is essentially an inverse of the AM to FM distortion of the power amplifier circuitry for one of a plurality of output power levels.

8. The transmitter of claim 5 wherein the compensation circuitry operates to provide the frequency compensation signal such that the frequency compensation signal is essentially equal to a product of the polynomial and a derivative of the amplitude signal.

9. The transmitter of claim 8 wherein the plurality of sets of coefficients are provided such that for each of the plurality of polynomials the product of the polynomial and the derivative of the amplitude signal is essentially equal to a derivative of a function that is essentially an inverse of an AM to PM distortion of the amplifier circuitry for one of the plurality of power levels.

10. The transmitter of claim 1 wherein the compensation circuitry comprises:
   first circuitry adapted to provide a first signal based the amplitude signal and a polynomial defined by a set of coefficients;
   second circuitry adapted to provide a second signal approximately equal to a derivative of the amplitude signal; and
   multiplication circuitry adapted to multiply the first signal and the second signal to provide the frequency compensation signal.

11. The transmitter of claim 10 further comprising circuitry for storing a plurality of sets of coefficients defining a plurality of polynomials including the polynomial, each of the plurality of polynomials corresponding to one of a plurality of output power levels of the amplifier circuitry.

12. The transmitter of claim 11 wherein the compensation circuitry further operates to select the set of coefficients from the plurality of sets of coefficients based a power level of the amplifier circuitry.

13. The transmitter of claim 12 wherein the plurality of sets of coefficients are provided such that the frequency compensation signal is essentially an inverse of the AM to FM distortion of the power amplifier circuitry for each of the plurality of output power levels.

14. The transmitter of claim 1 further wherein the pre-distorted frequency signal is a digital signal and the transmitter further comprises:
   a phase-locked loop adapted to generate an analog output signal based on the pre-distorted frequency signal; and
   the power amplifier circuitry adapted to amplify the analog output signal and having an output power controlled based on the amplitude signal.

15. A method of compensating for distortion of a power amplifier in a transmitter comprising:
   converting the signal into a polar signal comprising an amplitude signal and a phase signal;
   converting the phase signal into a frequency signal;
   providing a frequency compensation signal based on the amplitude signal such that the frequency compensation signal is essentially an inverse of an AM to FM distortion of the power amplifier;
   combining the frequency signal and the frequency compensation signal to provide a pre-distorted frequency signal.

16. The method of claim 15 wherein the step of providing the frequency compensation signal further comprises providing the frequency compensation signal based on a power level of the power amplifier.

17. The method of claim 15 wherein the step of providing the frequency compensation signal further comprises providing the frequency compensation signal based on a polynomial defined by a set of coefficients.

18. The method of claim 17 wherein the polynomial is at least a first order polynomial.

19. The method of claim 17 further comprising selecting the set of coefficients defining the polynomial from a plurality of sets of coefficients defining a plurality of polynomials including the polynomial based on an output power level of the power amplifier, each of the plurality of sets of coefficients defining one of the plurality of polynomials corresponding to one of a plurality of output power levels.

20. The method of claim 19 further comprising providing the plurality of sets of coefficients defining the plurality of polynomials based on different predistortion criteria for each of the plurality of power levels.

21. The method of claim 19 further comprising providing the plurality of sets of coefficients defining the plurality of polynomials such that for each of the plurality of polynomials the frequency compensation signal is essentially an inverse of the AM to FM distortion of the power amplifier for one of the plurality of power levels.

22. The method of claim 19 wherein the step of providing the frequency compensation signal comprises multiplying the polynomial and a derivative of the amplitude signal to provide the frequency compensation signal.

23. The method of claim 22 further comprising providing the plurality of sets of coefficients defining the plurality of polynomials such that for each of the plurality of polynomials a product of the polynomial and the derivative of the amplitude signal is essentially equal to a derivative of a function that is essentially an inverse of an AM to PM distortion of the power amplifier for one of the plurality of power levels.

24. The method of claim 15 wherein the pre-distorted frequency signal is a digital signal and the method further comprises:
   generating an analog signal based on the pre-distorted frequency signal; and
   amplifying the analog signal based on the amplitude signal.

* * * * *